(12) United States Patent
Varner et al.

(10) Patent No.: US 9,948,242 B2
(45) Date of Patent: Apr. 17, 2018

(54) SELECTABLE CURRENT LIMITER CIRCUIT

(71) Applicant: Apex Microtechnology, Inc., Tucson, AZ (US)

(72) Inventors: Alan Lee Varner, Tucson, AZ (US); Gregory Michael Patchin, Tucson, AZ (US); Kirby Neil Gaulin, Tucson, AZ (US)

(73) Assignee: APEX MICROTECHNOLOGY, INC., Tucson, AZ (US)

( * ) Notice: Subject to any disclaimer, the term of this patent is extended or adjusted under 35 U.S.C. 154(b) by 0 days.

(21) Appl. No.: 15/226,581

(22) Filed: Aug. 2, 2016

(65) Prior Publication Data

US 2018/0041171 A1   Feb. 8, 2018

(51) Int. Cl.
  *H03F 1/52*    (2006.01)
  *H03F 1/02*    (2006.01)
  *H03F 3/45*    (2006.01)

(52) U.S. Cl.
  CPC ....... *H03F 1/0233* (2013.01); *H03F 3/45179* (2013.01); *H03F 2200/555* (2013.01); *H03F 2203/45022* (2013.01)

(58) Field of Classification Search
  CPC .............. H03F 1/52; H03G 3/20; H03K 5/08
  USPC ...... 330/144, 207 P, 284, 298; 327/309, 316
  See application file for complete search history.

(56) References Cited

U.S. PATENT DOCUMENTS 4,321,554 A * 3/1982 Quilter ................. H03F 1/52
                                                 330/297
6,597,240 B1 * 7/2003 Walburger ............ H03F 3/2171
                                                 330/10

* cited by examiner

*Primary Examiner* — Steven J Mottola
(74) *Attorney, Agent, or Firm* — Ballard Spahr LLP

(57) ABSTRACT

A selectable current limiter circuit to limit the current an amplifier with a load. The limiter circuit limits the current of an amplifier by comparing a voltage reference that follows the output swing of the amplifier to voltage drop across a current limiting resistor coupled to the output of the amplifier. The limiter circuits are operatively coupled to buffer and switch circuits that delay the current limiting until the limiter circuits are activated.

20 Claims, 6 Drawing Sheets

(Differential Pair Limiters)

(Reference Voltage as a Zero TC Bandgap Generator)

SELECTABLE CURRENT LIMITER CIRCUIT

FIELD

Aspects of the present disclosure relate generally to electronic amplification, and more particularly to apparatuses and methods of limiting the current of amplifiers.

BACKGROUND

Amplifiers are employed in a wide variety of settings in electronics. Many such circuits have current regulation. Some applications for these circuits draw excessive current during power on, which can cause system components to burn up due to improper powering of supplies. Other applications may need to limit the current provided by an operational amplifier (also called an "op amp") to a load, or due to other considerations. For example, amplifiers with applications in testing equipment, industrial printing, and general high voltage or current applications, among others, may require current limiting to avoid operational breakdown or other failures of the amplifiers.

Current limiting circuits, such as those dependent on base-emitter voltages of bipolar junction transistors or those dependent on other component process characteristics or parameters, can be susceptible to performance variation and inaccuracies as temperature or process characteristics or parameters change. Base-emitter, or $V_{be}$-based schemes typically divide an approximate diode voltage by the desired current to determine the size of a current-limiting resistor to achieve desired current limitation. Such $V_{be}$-based schemes may vary widely over process, and may have a negative temperature coefficient (TC) of approximately 2 mV per degree Celsius, meaning the current limit is not substantially constant over temperature or process. Other current limiting circuits, such as those scaled to an output device current that is used for detection, may not be feasible under design or other constraints, and may waste power or other resources. Some current limiting circuits may also depend on varying parameters and may not allow for selectable current limits.

SUMMARY

In some aspects of the present disclosure, a set resistor is configured to receive a reference voltage that has a substantially constant voltage. A first reference resistor is configured to receive a first reference current from the reference voltage and the set resistor, and a second reference resistor is configured to receive a second reference current from the reference voltage and the set resistor. The first and second reference resistors are configured to substantially track the set resistor, such that each of the voltage drops across the first and second reference resistors is substantially constant. An amplifier with a positive and negative current limit is configured to receive a positive and a negative signal current. A limiting resistor is configured to receive an output voltage and an output current generated by the amplifier. A load is configured to be operatively coupled to the first and second reference resistors, the output voltage, and the limiting resistor.

A first limiter circuit is operatively coupled to the first reference resistor, the limiting resistor, and the amplifier so as to sink the positive signal current once the output current substantially equals the positive current limit, and to maintain the output current at a value no greater than the positive current limit while the first limiter circuit is in an active state. A second limiter circuit is operatively coupled to the second reference resistor, the limiting resistor, and the amplifier so as to source the negative signal current once the output current substantially equals the negative current limit, and to maintain the output current at a value no less than the negative current limit while the second limiter circuit is in an active state.

In other aspects of the present disclosure, a method comprises receiving, at a set resistor, a reference voltage that has a substantially constant voltage. The method further comprises receiving, at a first reference resistor, a first reference current from the reference voltage and the set resistor. The method further comprises receiving, at a second reference resistor, a second reference current from the reference voltage and the set resistor, and substantially tracking the first and second reference resistors with the set resistor such that each of the voltage drops across the first and second reference resistors is substantially constant. The method further comprises receiving a positive signal current and a negative signal current at an amplifier that has a positive and negative current limit. The method further comprises receiving, at a limiting resistor, an output voltage and output current generated by the amplifier, and operatively coupling a load to the first and second reference resistors, the output voltage, and the limiting resistor.

The method further comprises operatively coupling a first limiter circuit to the first reference resistor, the limiting resistor, and the amplifier so as to sink the positive signal current once the output current substantially equals the positive current limit, and to maintain the output current at a value no greater than the positive current limit while the first limiter circuit is in an active state. The method further comprises operatively coupling a second limiter circuit to the second reference resistor, the limiting resistor, and the amplifier so as to source the negative signal current once the output current substantially equals the negative current limit and to maintain the output current at a value no less than the negative current limit while the second limiter circuit is in an active state.

In some aspects, the first limiter circuit is an n-channel operational amplifier, and the second limiter circuit is a p-channel operational amplifier, or vice versa. In other aspects, the first limiter circuit is a PNP differential transistor pair and the second limiter circuit is an NPN differential transistor pair, or vice versa. In other aspects, the reference voltage comprises a low temperature coefficient voltage reference.

In other aspects, the first limiter circuit comprises a first operational amplifier, a first buffer circuit, and a first switch circuit operatively coupled to each other such that the first switch circuit delays the first limiter circuit sinking the positive signal current through the first buffer circuit until the first limiter circuit is activated. In this aspect, the second limiter circuit comprises a second operational amplifier, a second buffer circuit, and a second switch circuit operatively coupled to each other such that the second switch circuit delays the second limiter circuit sourcing the negative signal current through the second buffer circuit until the first limiter circuit is activated. In other aspects, the buffer circuits and switch circuits are comprised of transistors.

In other aspects, a first voltage arising from the first reference current received by the first reference resistor is substantially constant over temperature, and a second voltage arising from the second reference current received by the second reference resistor is substantially constant over temperature.

BRIEF DESCRIPTION OF THE DRAWINGS

The following will be apparent from elements of the figures, which are provided for illustrative purposes and are not limiting and are not necessarily to scale or complete.

DETAILED DESCRIPTION

This description of the exemplary aspects of the disclosure is intended to be read in connection with the accompanying drawings, which are to be considered part of the entire written description.

Aspects of the present disclosure include methods and apparatuses to limit the current of an amplifier with a load. In various aspects, limiter circuits limit the current of an amplifier by comparing a voltage reference that follows the output swing of the amplifier to a voltage drop across a current limiting resistor coupled to the output of the amplifier. In other aspects, the limiter circuits are operatively coupled to buffer and switch circuits that delay the current limiting until the limiter circuits are activated.

Figure 1:
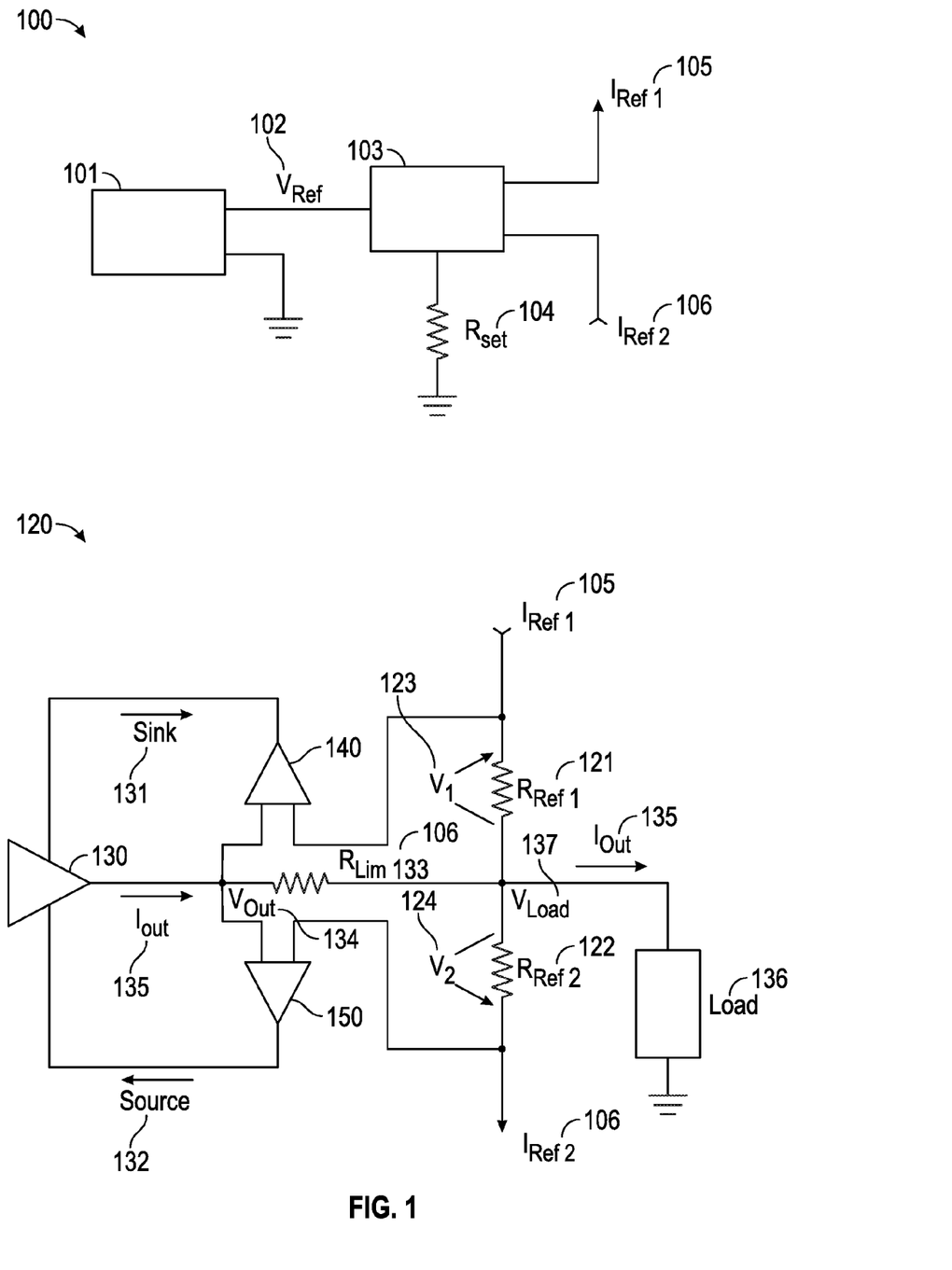
FIG. 1 is a simplified schematic of a voltage reference and a selectable current limiter circuit for an amplifier in configurations in accordance with some aspects of the present disclosure.

FIG. 1 shows a simplified schematic of a voltage reference 100 and a selectable current limiter circuit 120 for an amplifier 130, in configurations in accordance with certain aspects of the present disclosure. In accordance with this aspect of the disclosure, a voltage source 101 generates a substantially constant voltage, $V_{REF}$ 102, which is coupled to a voltage-controlled current source 103. The voltage-controlled current source 103 is coupled to ground (or other point of voltage reference) through a resistor, $R_{SET}$ 104. The voltage-controlled current source 103 generates a first reference current 105 and a second reference current 106 that, in certain aspects of the disclosure, are of approximately equal magnitude, which is approximately the value of the current flowing through $R_{SET}$ 104, which is $V_{REF} R_{SET}$ in the aspect of the disclosure where $R_{SET}$ 104 is connected to ground. It will be appreciated therefore that the magnitude of the first reference current 105 and the second reference current 106 may be chosen based on the selection of $R_{SET}$ 104 and $V_{REF}$ 102.

In this aspect of the disclosure, the selectable current limiter circuit 120 comprises a first reference resistor, $R_{REF1}$ 121, that is configured to receive the first reference current 105, and a second reference resistor, $R_{REF2}$ 122, that is configured to receive the second reference current 106. The first and second reference resistors 121-122 are configured to substantially track the set resistor $R_{SET}$ 104, for example over temperature and process variations, resulting in substantially constant voltage drops ($V_1$ 123, $V_2$ 124) across the first and second reference resistors 121-122. For example, reference resistors 121-122 may be chosen to be scaled and matched to $R_{SET}$ 104, such that the two reference currents 105 and 106 similarly track each other over process, keeping the reference voltage substantially constant over process. Similarly, in this aspect, as the TC of the resistors change over temperature, the reference currents will change and will offset the TC changes of reference resistors 121 and 122, generating a substantially constant voltage reference over temperature. Substantially constant in this aspect of the disclosure can mean that the substantially constant voltage (for example, $V_{REF}$ 102, $V_1$ 123, or $V_2$ 124) may vary by approximately ±2%. Substantially tracking resistors $R_{SET}$ 104, $R_{REF1}$ 121, $R_{REF2}$ 122 in this aspect of the disclosure can mean that the resistors are matched, scaled, or otherwise produced or manufactured such that their temperature or process fluctuations vary by approximately ±1% or to achieve the substantially constant voltage.

Also in this aspect, an amplifier 130 with a positive and negative current limit is configured to receive a positive signal current 131 and a negative signal current 132. The amplifier 130 can be any type of amplifier known in the art, such as an operational amplifier, a differential amplifier, a transistor amplifier, a feedback amplifier, an open or closed loop amplifier, Apex Microtechnology® amplifiers such as those having part numbers PA52, PA85, PA163, PA164, PA165, and the like, of any class. A limiting resistor $R_{LIM}$ 133 is configured to receive an output voltage $V_{OUT}$ 134 and an output current $I_{OUT}$ 135 generated by the amplifier 130. A load 136 is configured to be operatively coupled to the first and second reference resistors 121-122, a load voltage 137, and the output voltage 134 through limiting resistor 133. The load 136 can be of any impedance, resistive element, network, or module to be powered by the amplifier 130.

Also in this aspect, a first limiter circuit 140 is operatively coupled to the first reference resistor 121, the limiting resistor 133, and the amplifier 130 so as to sink the positive signal current 131 once the output current 135 substantially equals the positive current limit of the amplifier 130. For purposes of this aspect, the output current 135 substantially equals the positive current limit of the amplifier 130 when the output current 135 is within approximately ±4% of the positive current limit of the amplifier 130. In this aspect, the first limiter circuit 140, while activated, maintains the output current 135 at a value no greater than the positive current limit of amplifier 130. To limit the output current 135 of the amplifier 130 to the desired value, in this aspect of the disclosure, the limiter circuit 140 compares the reference voltage $V_1$ 123 with the voltage drop across the current limit resistor $R_{LIM}$ 133 ($V_{OUT}$ 134–$V_{LOAD}$ 137). If the voltage drop across the current limit resistor $R_{LIM}$ 133 exceeds $V_1$ 123, then the limiter circuit 140 activates to sink the positive signal current 131.

Also in this aspect of the disclosure, a second limiter circuit 150 is operatively coupled to the second reference resistor 122, the limiting resistor 133, and the amplifier 130 so as to source the negative signal current 132 once the output current 135 substantially equals the negative current limit of amplifier 130. In this aspect, the output current 135 is substantially equal to the negative current limit of amplifier 130 when the output current 135 is within approximately ±4% of the negative current limit of the amplifier 130. In this aspect, the second limiter circuit 150, while activated, maintains the output current 135 at a value no less than the negative current limit of amplifier 130. To limit the output current 135 of the amplifier 130 to the desired value, in this aspect of the disclosure, the limiter circuit 150 compares the reference voltage $V_2$ 124 with the voltage drop across the current limit resistor $R_{LIM}$ 133 ($V_{OUT}$ 134–$V_{LOAD}$ 137), and if $V_2$ 124 exceeds the current limit resistor $R_{LIM}$ 133 then the limiter circuit 150 activates to source the negative signal current 132.

It will be appreciated that, in this aspect of the disclosure, the voltages across resistors $R_{REF1}$ 121, $R_{REF2}$ 122 and $R_{LIM}$ 133 essentially ride up and down with the output signal 134-135 of amplifier 130, limiting the output current 135 to a chosen value independent of the load voltage $V_{LOAD}$ 137. It will also be appreciated that the current limiting achieved by this aspect of the disclosure generally provides accuracy and performance over temperature and process variations. It will also be appreciated that, in this aspect, temperature coefficient (TC) variations in resistors $R_{REF1}$ 121, $R_{REF2}$ 122 and $R_{SET}$ 104 generate similar changes in the reference currents 105-106, keeping the reference voltages $V_1$ 123 and $V_2$ 124 substantially constant as disclosed.

Figure 2:
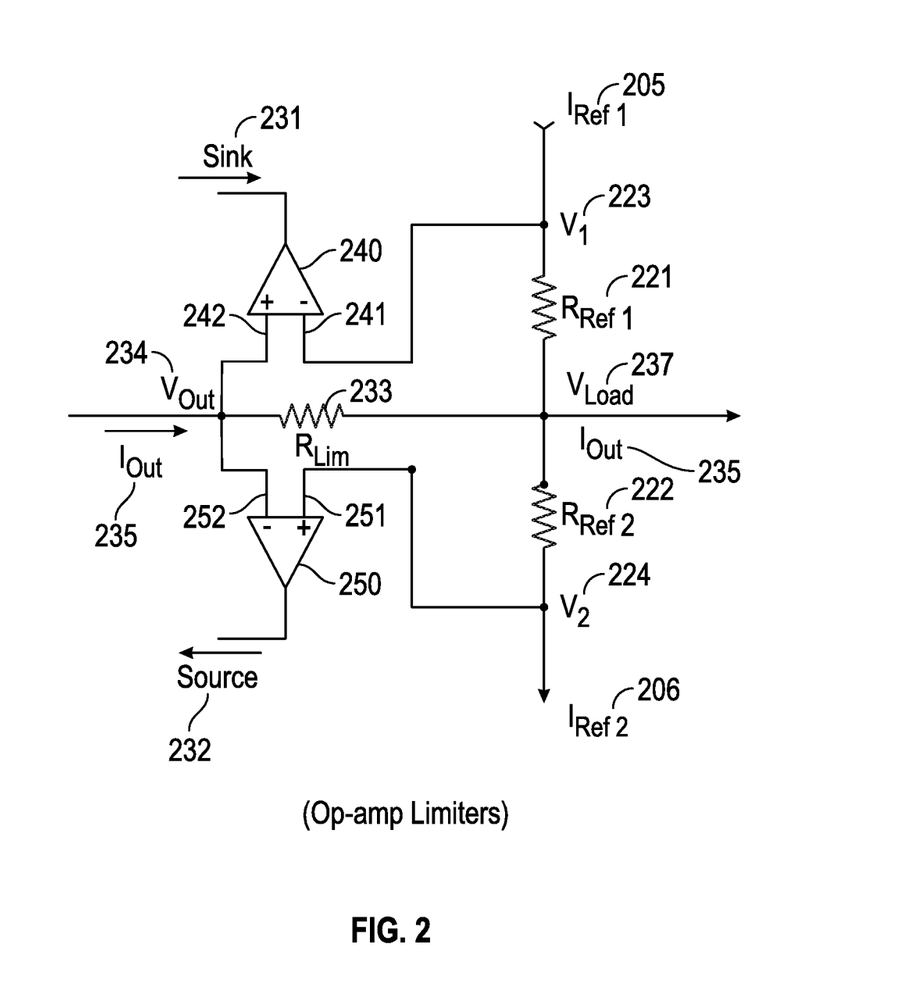
FIG. 2 is a simplified schematic of a selectable current limiter circuit implemented with operational amplifiers in configurations in accordance with some aspects of the present disclosure.

FIG. 2 shows a simplified schematic of the selectable current limiter circuit according to FIG. 1 implemented with operational amplifiers (or "op amp") in configurations in accordance with certain aspects of the present disclosure. In accordance with this aspect of the disclosure, first limiter circuit 240 is implemented with an n-channel operational amplifier or similar device. In accordance with the operation described in connection with FIG. 1 for sinking positive signal current of amplifier 130, inverting input 241 is coupled to the positive node of the first reference resistor, $R_{REF1}$ 221, through which first reference current $I_{REF1}$ 205 is flowing, which is at voltage $V_1$ 223. In this aspect, non-inverting input 242 is coupled to the node of the current limiting resistor $R_{LIM}$ 233 that is coupled to the output of amplifier 130 (not shown), which is at voltage $V_{OUT}$ 234.

Also in this aspect, and in accordance with the operation described in connection with FIG. 1 for sourcing negative signal current of amplifier 130, second limiter circuit 250 is implemented with a p-channel operational amplifier or similar device. Non-inverting input 251 is coupled to the second reference resistor, $R_{REF2}$ 222, through which second reference current $I_{REF2}$ 206 is flowing, at the node at voltage $V_2$ 224. Inverting input 252 is coupled to the node of the current limiting resistor $R_{LIM}$ 233 that is coupled to the output of amplifier 130 (not shown), which is at voltage $V_{OUT}$ 234. It will be appreciated that, with the appropriate modifications to account for voltage polarity and current direction, operational amplifiers 240 and 250 can be implemented using all n-channel devices, all p-channel devices, or with channel-type reversed as compared with the devices shown in FIG. 2.

According to this aspect, once either op amp 240 or 250 becomes active, its feedback loop is closed through an output transistor (not shown in FIG. 2) back to the op amp's inputs. Closing the loop generally maintains the output of main amplifier 130 at the desired point. The main amplifier 130 remains closed loop until such case as the current limit amplifiers 240 or 250 have sunk or sourced, respectively, approximately all the signal current the amplifier 130 has to offer. At this point, the current limit amplifier loop is typically the sole loop in control. As current is taken from the amplifier signals 231-232, voltage of the positive (non-inverting) input 242 becomes positive, turning the output voltage of op amp 240 negative. Thus, in this aspect, the signal fed back becomes a positive voltage on the non-inverting input of op amp 240, resulting in the desired negative feedback. Op amp 250 generally operates in the opposite way to source current and to achieve the desired negative feedback. It will be appreciated that current limit amplifiers 240 and 250 can be of any various designs. Accurate gain in the current limit amplifiers 240 and 250 reduces errors in the current limiting.

Figure 3:
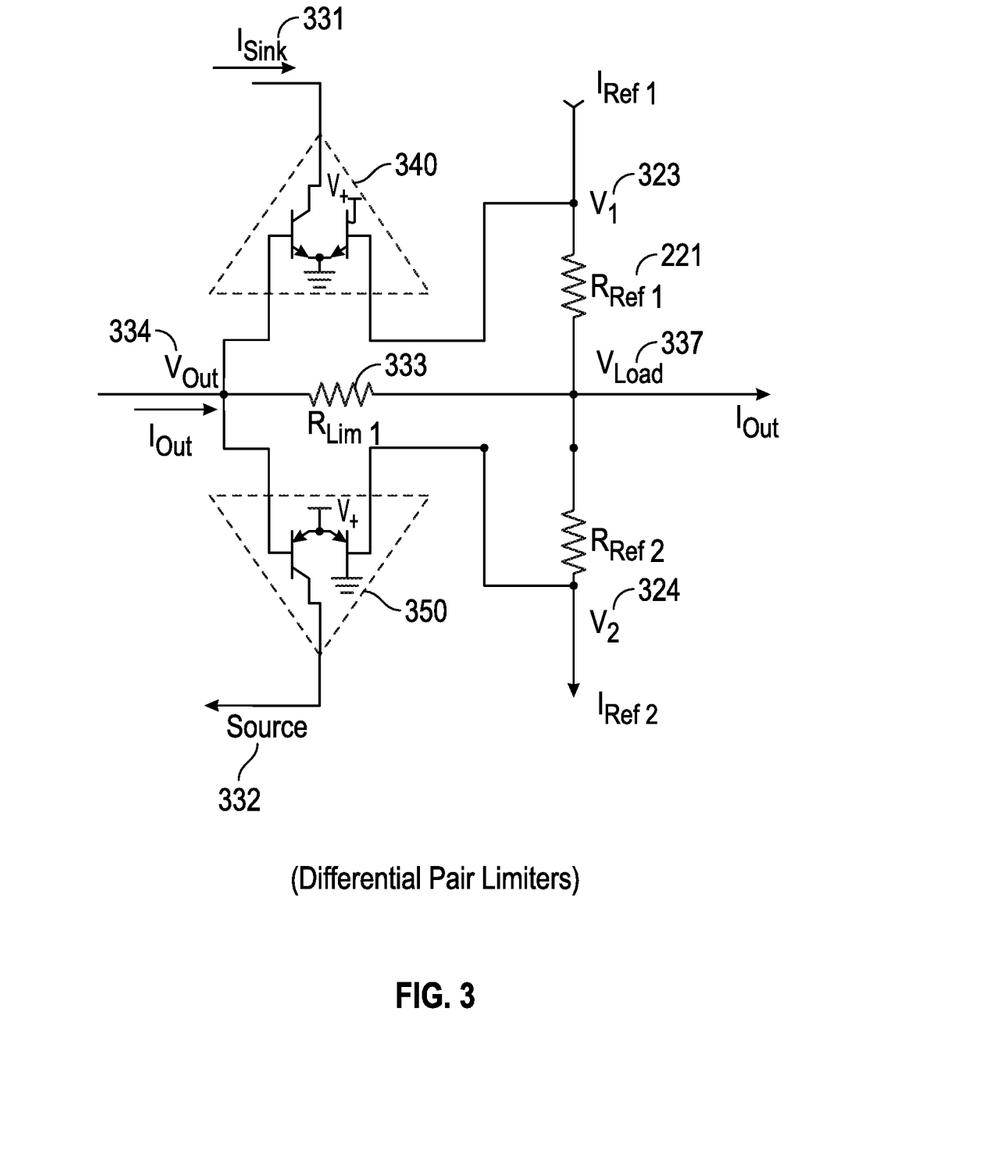
FIG. 3 is a simplified schematic of a selectable current limiter circuit implemented with differential transistor pairs in configurations in accordance with some aspects of the present disclosure.

FIG. 3 shows a simplified schematic of a selectable current limiter circuit of FIG. 1 implemented with differential transistor pairs 340, 350 in configurations in accordance with some aspects of the present disclosure. In accordance with this aspect of the disclosure, the voltage across current-limiting resistor $R_{LIM}$ 333 ($V_{OUT}$ 334–$V_{LOAD}$ 337) is monitored by differential pairs 340 and 350. In this aspect, differential pair 340 turns on to sink signal current 331 approximately when the voltage across $R_{LIM}$ 333 exceeds the first reference voltage $V_1$ 323, while differential pair 350 turns on to source signal current 332 approximately when $V_2$ 324 exceeds the voltage across $R_{LIM}$ 333. It will be appreciated that NPN and PNP differential bipolar junction transistor pairs may be used as shown for example in FIG. 3 or, with the appropriate circuitry, all NPN or all PNP differential pairs, or any type of transistor or semiconductor-based differential pairs such as CMOS or JFET may be used, instead.

Figure 4:
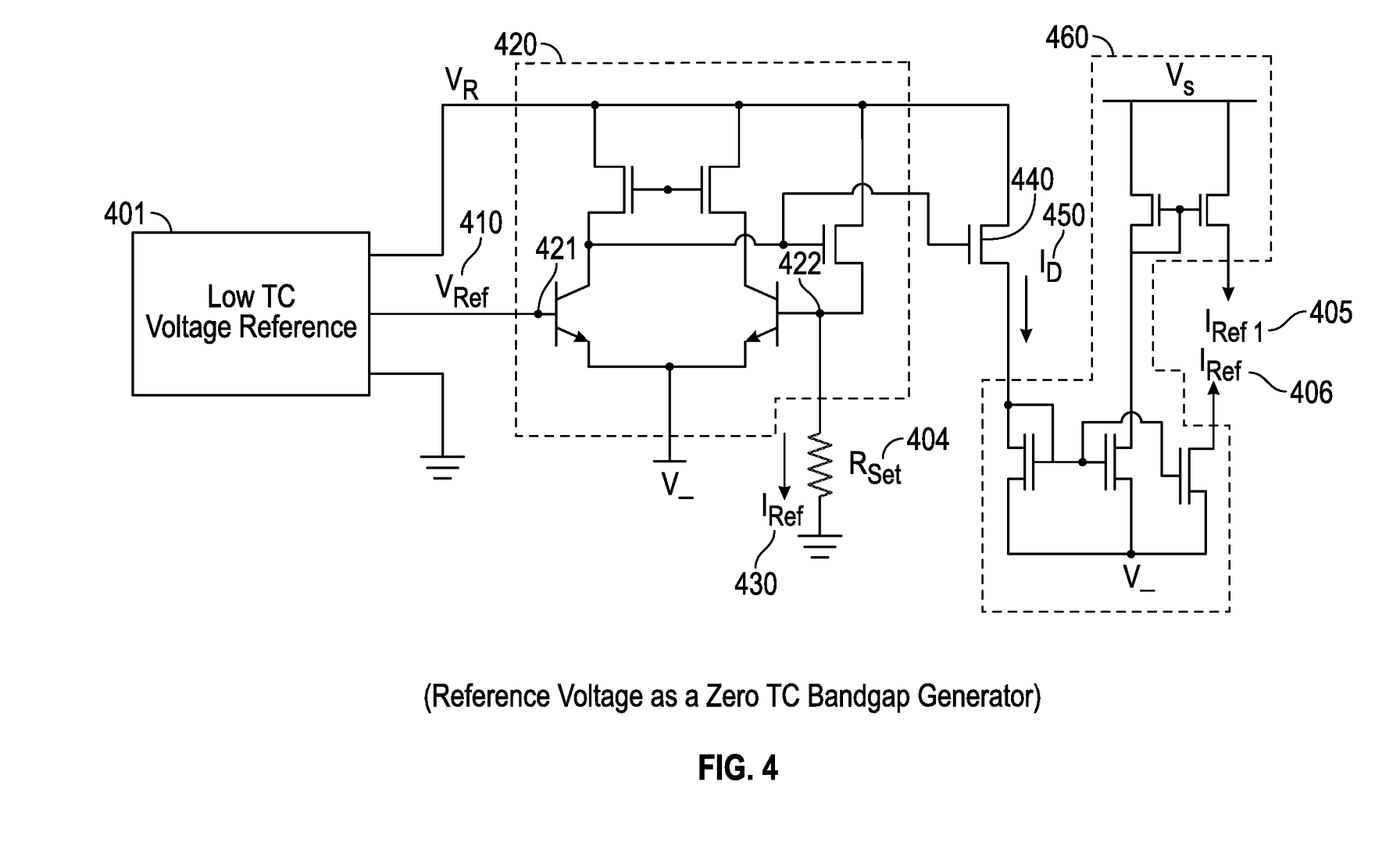
FIG. 4 is a simplified schematic of a voltage reference implemented with a low temperature coefficient voltage reference in configurations in accordance with some aspects of the present disclosure.

FIG. 4 shows a simplified schematic of a voltage reference implemented with a low temperature coefficient voltage reference in configurations in accordance with some aspects of the present disclosure. According to this aspect, a reference voltage $V_{REF}$ 410, for example 1.25V, may be generated by a low temperature coefficient voltage reference source, such as a zero TC bandgap reference or any other type of low TC reference or substantially constant voltage source. In this aspect, $V_{REF}$ 410 serves as an input to a standard transistor network or op amp 420. Op amp 420 may force nodes 421 and 422 to be the same voltage, such as 1.25V in the example where $V_{REF}$ 410 is set at 1.25V. By coupling $R_{SET}$ 404 to node 422 and ground (or other low reference point), a selectable reference current 430 may be forced to flow through selectable $R_{SET}$. For example, 1.25V/$R_{SET}$ results in a reference current 430 of 200 µA. In this aspect, current 430 is supplied by output field effect transistor (FET) 423 in op amp circuit 420. The gate-source voltage (Vgs) of FET 423 may then be impressed across the gate-source voltage (Vgs) of another FET 440 that provides drain current $I_D$ 450 that, as a result, tracks and follows the current through $R_{SET}$, which is $I_{REF}$ 430. In this aspect, drain current 450 may then be mirrored according to standard current-mirror configurations, such as current mirror 460, to generate reference currents $I_{REF1}$ 405 and $I_{REF2}$ 406.

Figure 5:
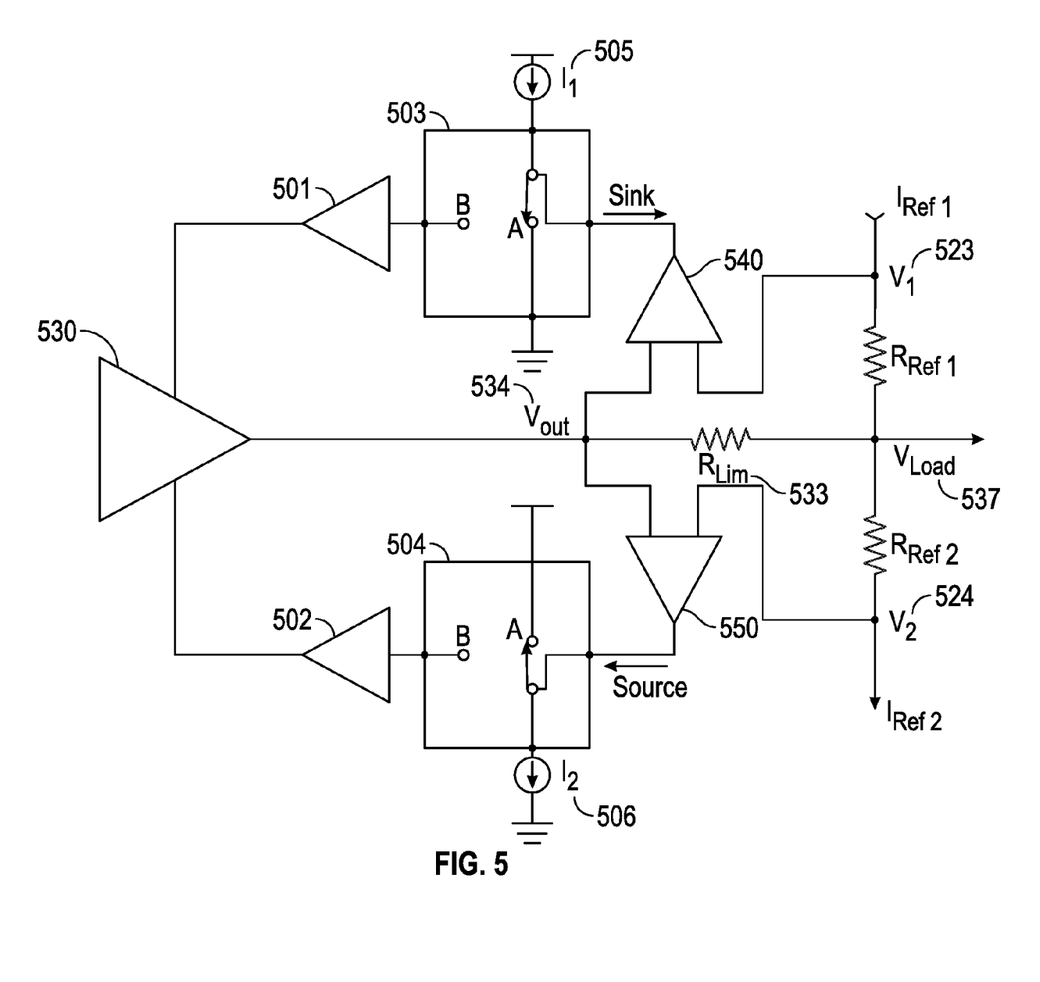
FIG. 5 is a simplified schematic of a selectable current limiter circuit for an amplifier implemented with buffer circuits and switch circuits in configurations in accordance with some aspects of the present disclosure.

FIG. 5 shows a simplified schematic of a selectable current limiter circuit for an amplifier implemented with buffer circuits 501-502 and switch circuits 503-504 in configurations in accordance with some aspects of the present disclosure. According to this aspect of the disclosure, buffer circuits 501-502 and switch circuits 503-504 may improve the speed and accuracy of the current limiting of the configuration of FIG. 1 and other configurations within the disclosure. In aspects of the disclosure according to FIG. 1, for example, prior to current limit, the current limit amplifiers 140 and 150 are off. In full current limit, the current limit amplifier 140 (for positive current limit) or 150 (for negative current limit) may be fully on with the inputs to the amplifier balanced and full open loop gain. Thus, referring to the disclosure of the configuration in FIG. 1, as the differential signal inputs to either limiter circuit 140 or 150 begins to increase as current limit approaches, the input stage of limiter circuit 140 or 150 begins to turn on. At this point, the amplifier 140 or 150 may not be fully on, but it may begin to draw an inaccurate signal current before it is desired. This may lead to slow rising and falling edges at the output of the main amplifier 130, as the current limit amplifier may be stealing slewing current. Other inaccuracies may appear that are dependent upon input signal characteristics, and may cause input signal-dependent current limit delays.

According to the aspect of the disclosure shown in FIG. 5, buffer circuits 501 and 502 delay the sinking or sourcing, respectively, of limiter circuits 540 and 550 until they are fully activated and drawing accurate signal current. It will be appreciated that buffer circuits 501-502 may be configured to be implemented using any semiconductor-type of buffering device such as, for example, a transistor, op-amp, follower, or the like. It will also be appreciated that switch circuits 503-504 may be configured to be implemented using any type of signal-controlled semiconductor-type switching device such as, for example, a current-controlled transistor switch. In this aspect of the disclosure, so long as current source $I_1$ 505 is supplied to switch circuit 503, the switch remains in position A according to the configuration in FIG. 5. As limiter circuit 540 turns on, it sinks $I_1$ 505 and in turn flips the switch of switch circuit 503 to position B according to the configuration in FIG. 5. Similarly, so long as current source $I_2$ 506 is supplied to switch circuit 504, the switch remains in position A according to the configuration in FIG. 5. As limiter circuit 540 turns on, it sinks $I_1$ 505 and in turn flips the switch of switch circuit 503 to position B according to the configuration in FIG. 5. Also according to this aspect, switches 503 and 504 are triggered by buffer circuits 501 and 502 and limiter circuits 540 and 550, respectively, once current limit has been reached and limiter circuits 540 and 550, respectively, are completely on. Buffer 501 sinks signal current for limiter circuit 540 at positive current limit of amplifier 530, while buffer circuit 502 sources signal current for limiter circuit 550 at negative current limit of amplifier 530, as the case may be. It will be appreciated that current sources $I_1$ 505 and $I_2$ 506 may be configured to be implemented using any current source available within configurations of the present disclosure.

Figure 6:
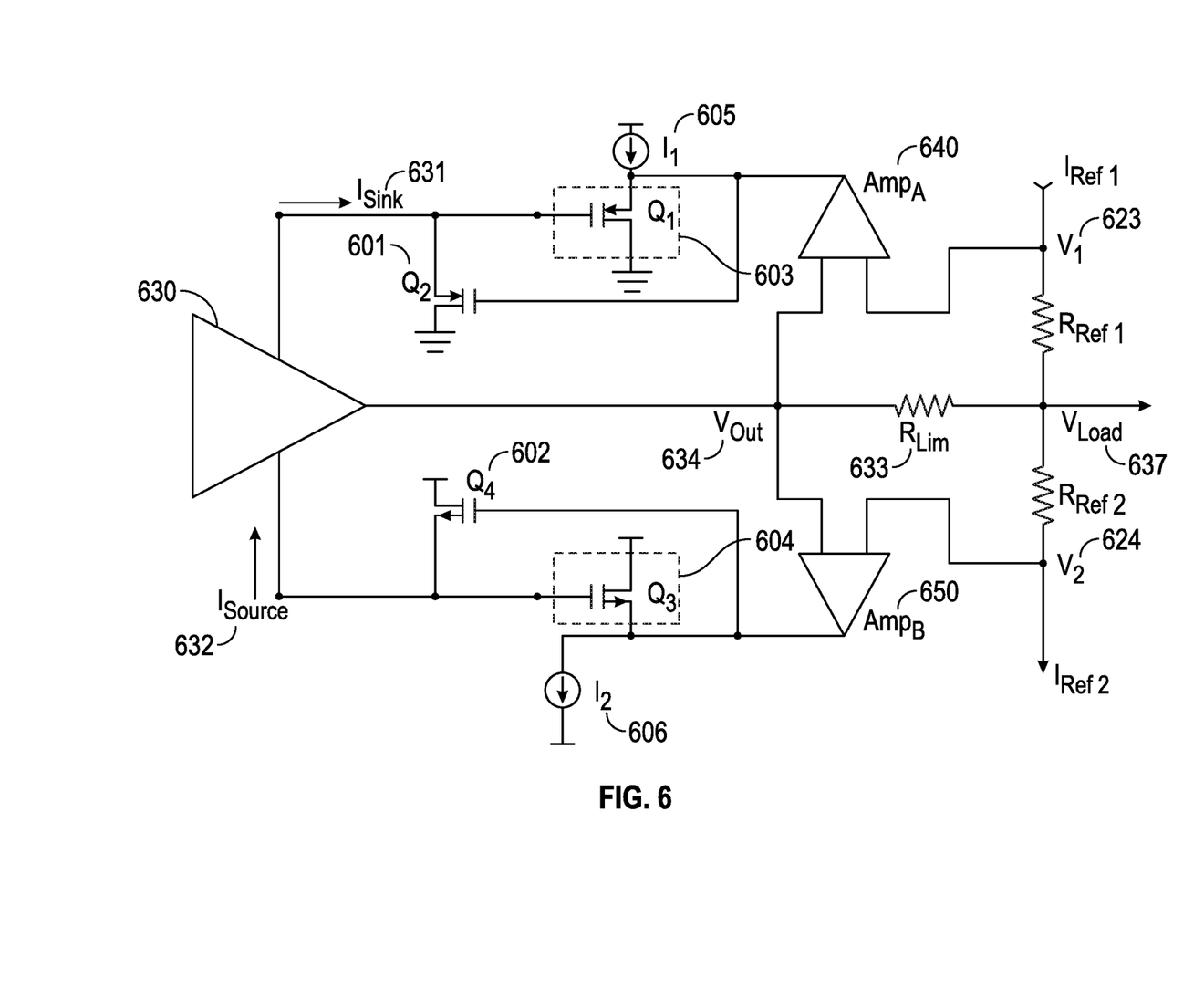
FIG. 6 is a simplified schematic of a selectable current limiter circuit for an amplifier implemented with buffer circuits and switch circuits implemented with transistors in configurations in accordance with some aspects of the present disclosure.

FIG. 6 shows a simplified schematic of a selectable current limiter circuit for an amplifier implemented with buffer circuits and switch circuits according to FIG. 5, configured to be implemented with transistors in configurations in accordance with some aspects of the present disclosure. According to this aspect, adding switch circuit FETs Q1 603 and Q3 604, may increase accuracy or current limit performance behavior in a configuration, for example, in a so-called "teeter totter" type of switch arrangement that delays the current limit amplifiers 640 or 650 from taking control of the signal current until either is fully on and functioning like a feedback amplifier. When not in current limit mode, buffer circuit FETs Q2 601 and Q4 602 are off and the current limit amplifiers 640 and 650 are off, while Q1 603 and Q3 604 are on.

In this aspect, for example, before positive current limit is reached, $I_1$ 605 forces its current through Q1 603. The gate of Q1 603 essentially follows the output signal 631 of amplifier 630. Since the gate of Q1 603 is set, the current flowing through it causes its source to go positive, making sure Q2 601 is cut off, as its source is fixed and the gate of the p-channel device Q2 601 is going positive. As positive current limit approaches, limiter circuit 640 begins to turn on, sinking current from $I_1$ 605, pulling down on the gate of Q2 601. This makes the source of Q1 603 go negative, reducing the current in Q1 603 until it is totally off and Q2 601 is totally on. Control of the signal current by limiter circuit 640 may not start happening as limiter circuit 640 begins to turn on, as it may in the aspect of the disclosure according to FIG. 1. As such, there is a type of cancellation in the input stage transition of limiter circuit 640 as compared to the transition of control from FETs Q1 603 to Q2 601, allowing the amplifier 640 to operate in its linear range before taking control of the signal current 631 for an accurate current limit. This aspect of the disclosure may improve AC or DC performance of the current limit circuitry or give predictable, reliable behavior. The process is the same for the negative current limit aspect of FIG. 6, with Q4 602 being on in non-current limit and Q4 602 off. When negative current limit takes place, Q3 604 switches off and Q4 602 switches on to source signal current 632.

Although examples are illustrated and described herein, embodiments are nevertheless not limited to the details shown, since various modifications and structural changes may be made therein by those of ordinary skill within the scope and range of equivalents of the claims. For example, although ideal operational amplifiers have been disclosed as exemplary, it will be appreciated that this is not intended to mean that other devices could not be used instead. One skilled in the art would also appreciate that various components may be inter-placed between the components shown in the figures without departing from the operation of the disclosure, such as the insertion of current-limiting resistors, diodes, capacitors, transistors or other circuit components or modules between the limiter circuits and the amplifier inputs or outputs. One skilled in the art would also appreciate that various components such as resistors may be replaced with their functional equivalents, such as a resistive network or other element. It will also be appreciated that the descriptors of currents, voltages or circuit elements or aspects referred to in the present disclosure are not limiting or functionally or structurally descriptive. For example, one of ordinary skill will appreciate that a current referred to as a "signal current" could be the same current as a "driver current" according to various aspects or configurations of the disclosure.

What is claimed is:

1. An apparatus, comprising:
    a set resistor, configured to receive a reference voltage having a substantially constant voltage;
    a first reference resistor, configured to receive a first reference current from the reference voltage and the set resistor;
    a second reference resistor, configured to receive a second reference current from the reference voltage and the set resistor, the first and second reference resistors configured to substantially track the set resistor such that each of the voltage drops across the first and second reference resistors is substantially constant;
    an amplifier, configured to receive a positive supply current and a negative supply current, the amplifier having a positive current limit and a negative current limit;
    a limiting resistor, configured to receive an output voltage and an output current generated by the amplifier;
    a load, configured to be operatively coupled to the first and second reference resistors, the output voltage, and the limiting resistor;

a first limiter circuit, the first limiter circuit operatively coupled to the first reference resistor, the limiting resistor, and the amplifier so as to sink the positive supply current once the output current substantially equals the positive current limit and to maintain the output current at a value no greater than the positive current limit while the first limiter circuit is in an active state;

a second limiter circuit, the second limiter circuit operatively coupled to the second reference resistor, the limiting resistor, and the amplifier so as to source the negative supply current once the output current substantially equals the negative current limit and to maintain the output current at a value no less than the negative current limit while the second limiter circuit is in an active state.

2. The apparatus of claim 1, wherein the first limiter circuit is an n-channel operational amplifier, and the second limiter circuit is a p-channel operational amplifier.

3. The apparatus of claim 1, wherein the first limiter circuit is a p-channel operational amplifier, and the second limiter circuit is an n-channel operational amplifier.

4. The apparatus of claim 1, wherein the first limiter circuit is a PNP differential transistor pair and the second limiter circuit is an NPN differential transistor pair.

5. The apparatus of claim 1, wherein the first limiter circuit is an NPN differential transistor pair and the second limiter circuit is a PNP differential transistor pair.

6. The apparatus of claim 1, wherein the first limiter circuit is an NPN differential transistor pair and the second limiter circuit is a PNP differential transistor pair.

7. The apparatus of claim 1, wherein the reference voltage comprises a zero temperature coefficient bandgap generator.

8. The apparatus of claim 1, wherein the first limiter circuit further comprises a first switch operatively coupled to the amplifier so as to delay sinking the positive supply current until the first limiter circuit is activated, and the second limiter circuit further comprises a second switch operatively coupled to the amplifier so as to delay sourcing the negative supply current until the second limiter circuit is activated.

9. The apparatus of claim 8, wherein the first switch comprises a first transistor, and the second switch comprises a second transistor.

10. The apparatus of claim 1, wherein a first voltage arising from the first reference current received by the first reference resistor is substantially constant over temperature, and a second voltage arising from the second reference current received by the second reference resistor is substantially constant over temperature.

11. A method, comprising:
receiving, at a set resistor, a reference voltage having a substantially constant voltage;
receiving, at a first reference resistor, a first reference current from the reference voltage and the set resistor;
receiving, at a second reference resistor, a second reference current from the reference voltage and the set resistor;
substantially tracking the first and second reference resistors with the set resistor such that each of the voltage drops across the first and second reference resistors is substantially constant;
receiving a positive supply current and a negative supply current at an amplifier, the amplifier having a positive current limit and a negative current limit;
receiving, at a limiting resistor, an output voltage and an output current generated by the amplifier;
operatively coupling a load to the first and second reference resistors, the output voltage, and the limiting resistor;
operatively coupling a first limiter circuit to the first reference resistor, the limiting resistor, and the amplifier so as to sink the positive supply current once the output current substantially equals the positive current limit and to maintain the output current at a value no greater than the positive current limit while the first limiter circuit is in an active state;
operatively coupling a second limiter circuit to the second reference resistor, the limiting resistor, and the amplifier so as to source the negative supply current once the output current substantially equals the negative current limit and to maintain the output current at a value no less than the negative current limit while the second limiter circuit is in an active state.

12. The method of claim 11, wherein the first limiter circuit is an n-channel operational amplifier, and the second limiter circuit is a p-channel operational amplifier.

13. The method of claim 11, wherein the first limiter circuit is a p-channel operational amplifier, and the second limiter circuit is an n-channel operational amplifier.

14. The method of claim 11, wherein the first limiter circuit is a PNP differential transistor pair and the second limiter circuit is an NPN differential transistor pair.

15. The method of claim 11, wherein the first limiter circuit is an NPN differential transistor pair and the second limiter circuit is a PNP differential transistor pair.

16. The method of claim 11, wherein the first limiter circuit is an NPN differential transistor pair and the second limiter circuit is a PNP differential transistor pair.

17. The method of claim 11, wherein the reference voltage comprises a zero temperature coefficient bandgap generator.

18. The method of claim 11, wherein the first limiter circuit further comprises a first switch operatively coupled to the amplifier so as to delay sinking the positive supply current until the first limiter circuit is activated, and the second limiter circuit further comprises a second transistor switch operatively coupled to the amplifier so as to delay sourcing the negative supply current until the second limiter circuit is activated.

19. The method of claim 18, wherein the first switch comprises a first transistor, and the second switch comprises a second transistor.

20. The method of claim 11, wherein a first voltage arising from the first reference current received by the first reference resistor is substantially constant over temperature, and a second voltage arising from the second reference current received by the second reference resistor is substantially constant over temperature.

* * * * *